(12) United States Patent
Melanson et al.

(10) Patent No.: US 9,521,712 B1
(45) Date of Patent: Dec. 13, 2016

(54) MEASUREMENTS OF MULTIPLE EXTERNAL COMPONENTS THROUGH A SINGLE PIN OF AN INTEGRATED CIRCUIT

(71) Applicant: Cirrus Logic, Inc., Austin, TX (US)

(72) Inventors: John L. Melanson, Austin, TX (US);
Arnab Kumar Dutta, Austin, TX (US);
Stephen Hodapp, Austin, TX (US);
Prashanth Drakshapalli, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 189 days.

(21) Appl. No.: 14/445,732

(22) Filed: Jul. 29, 2014

Related U.S. Application Data

(60) Provisional application No. 61/859,629, filed on Jul. 29, 2013.

(51) Int. Cl.
*G01R 19/00* (2006.01)
*H05B 33/08* (2006.01)
*G01R 27/26* (2006.01)
*G01R 27/02* (2006.01)

(52) U.S. Cl.
CPC ........... *H05B 33/0803* (2013.01); *G01R 27/02* (2013.01); *G01R 27/2605* (2013.01)

(58) Field of Classification Search
CPC ............ H05B 33/0824; H05B 37/0218; H05B 33/0842; H05B 39/044; H05B 39/047; H05B 33/0872; Y02B 20/46; Y02B 70/12; Y02B 70/16; Y02B 20/345; Y02B 40/90; H02M 3/33507; H02M 2001/0006; H02M 3/156; H02M 3/335; H02M 1/08; H02M 3/00; H02M 3/155; H02M 3/33561; H02M 3/33592; H02M 2001/0009; H02M 2001/0045; H02M 2001/0032; H02M 3/158; Y10S 315/04; F21V 23/02; G01R 23/02; G01R 19/0046; G05F 1/70; H02J 2001/006
See application file for complete search history.

(56) References Cited

U.S. PATENT DOCUMENTS

| | | | |
|---|---|---|---|
| 6,229,385 B1 * | 5/2001 | Bell ................ | G01R 31/31701 327/536 |
| 8,487,591 B1 * | 7/2013 | Draper ..................... | H02J 7/00 320/166 |
| 2012/0025736 A1 * | 2/2012 | Singh .................... | H02M 3/156 315/307 |

* cited by examiner

*Primary Examiner* — Vinh Nguyen
(74) *Attorney, Agent, or Firm* — Norton Rose Fulbright US LLP

(57) ABSTRACT

Multiple measurements may be obtained via a single pin of an integrated circuit (IC) to set multiple control parameters of a light emitting diode (LED) controller within the IC. For example, a first input signal may be applied from the IC to two or more components via a single IC pin. A first output signal may be obtained from the two or more components via the single IC pin. A second input signal may be applied from the IC to the two or more components via the single IC pin, and a second output signal may be obtained from the two or more components via the single IC pin. A first parameter and a second parameter of the two or more components may be calculated based, at least in part, on the first output signal and the second output signal obtained via the single IC pin.

28 Claims, 6 Drawing Sheets

MEASUREMENTS OF MULTIPLE EXTERNAL COMPONENTS THROUGH A SINGLE PIN OF AN INTEGRATED CIRCUIT

CROSS-REFERENCE TO RELATED APPLICATIONS

This application claims the benefit of priority of U.S. Provisional Patent Application No. 61/859,629 to Melanson et al. filed Jul. 29, 2013 and entitled "Multiple Resistance Measurement on a Single Pin of an Integrated Circuit for Light Emitting Diode Controllers," which is hereby incorporated by reference.

FIELD OF THE DISCLOSURE

The instant disclosure relates to a light emitting diode (LED) controller. More specifically, this disclosure relates to an integrated circuit (IC) configured to obtain measurements for multiple components via a single pin.

BACKGROUND

Numerous parameters within an LED controller are used to initiate or modify operation of the LED controller. In conventional systems, most of the parameters can be read from a One Time Programmable (OTP) Read-only memory (ROM). However, an OTP ROM does not allow for the real-time adjustment of control parameters of an LED controller, hence reducing the LED controller's ability to adjust its operation while the LED is operational. For example, manufacturing variations in components external to the LED controller can be compensated for by measuring the external components and adjusting operation to compensate for the variations.

Contemporary ICs have attempted to address the foregoing limitations by dedicating a pin of the IC for each external component of the LED controller. For example, FIG. 1 provides an illustration of a contemporary IC for setting a control parameter of the LED controller while the LED is operational. As shown in FIG. 1, an IC 102 may have a dedicated pin 104 for obtaining a measurement from an external resistor 106 and adjusting a single control parameter of an LED controller 108 based on the obtained measurement.

One drawback of contemporary ICs with LED controllers, such as IC 102, is that measurement of each external component coupled to the LED controller requires a dedicated IC pin. IC pins are often large consumers of space in a packaged IC. Thus, a trade-off exists between a reduced IC size, which directly leads to lower costs, and obtaining data regarding external components, which directly leads to enhanced functionality and control by the LED controller. Because cost is often the driving force in business decisions, the number of pins in an IC is often limited, thereby reducing the number of control parameters an LED controller may have.

Shortcomings mentioned here are only representative and are included simply to highlight that a need exists for improved integrated circuits, particularly for lighting devices and consumer-level devices. Embodiments described here address certain shortcomings but not necessarily each and every one described here or known in the art.

SUMMARY

The cost of an IC may be reduced while simultaneously increasing the functionality and control provided by an LED controller of the IC by increasing the functions supported by the IC pins. For example, rather than dedicating a single IC pin for each external component to the LED controller, the IC may be configured to sense multiple external components using a single pin and use the multiple measurements to set multiple control parameters of the LED controller.

According to one embodiment, a method may include applying, via a single pin of an integrated circuit, a first input signal from the integrated circuit to two or more components, and obtaining a first output signal from the two or more components via the single pin of the integrated circuit. The method may also include applying, via the single pin of the integrated circuit, a second input signal from the integrated circuit to the two or more components, and obtaining a second output signal from the two or more components via the single pin of the integrated circuit. The method may further include calculating, by the integrated circuit, a first parameter of the two or more components and second parameter of the two or more components based, at least in part, on the first output signal and the second output signal obtained via the single pin.

According to another embodiment, an apparatus may include an integrated circuit configured to be coupled to two or more external components through a single pin, wherein the integrated circuit is configured to: apply, via the single pin, a first input signal to the two or more components; obtain, via the single pin, a first output signal from the two or more components; apply, via the single pin, a second input signal to the two or more components; obtain, via the single pin, a second output signal from the two or more components; and/or calculate at least a first parameter of the two or more components and a second parameter of the two or more components based, at least in part, on the first output signal and the second output signal obtained via the single pin. In some embodiments, the integrated circuit may include an LED controller for a LED-based light bulb.

In certain embodiments of the method or apparatus, the first parameter may be a first value of a first component of the two or more components and the second parameter may be a second value of a second component of the two or more components. In another embodiment of the method or apparatus, the first parameter may be a first value of a first component of the two or more components and the second parameter may be a ratio of the first value to a second value of a second component of the two or more components.

In some embodiments of the method or apparatus, the two or more components may include at least a first resistor and a second resistor, wherein calculating the first parameter may include calculating a first resistance of the first resistor and calculating the second parameter may include calculating a second resistance of the second resistor. In one embodiment of the method or apparatus, the step of applying the first input signal may include applying a first current input signal below a threshold level to activate a switch coupled to at least one of the two or more components, and the step of applying the second input signal may include applying a second current input signal above a threshold level to activate the switch. In another embodiment of the method or apparatus, the step of applying the first input signal may include applying a zero current input signal, and the step of applying the second input signal may include applying a non-zero current input signal. In addition, in some embodiments of the method or apparatus, the step of applying the second input signal may include generating the second input signal based, at least in part, on a supply voltage that is also supplied to the two or more components.

According to an embodiment of the method or apparatus, the two or more components may include at least a first resistor and a second resistor, and calculating the first parameter may include calculating a first ratio or combination of resistances of the first resistor and the second resistor and calculating the second parameter may include calculating a second ratio or combination of resistances of the first resistor and the second resistor.

In another embodiment of the method or apparatus, the two or more components may include at least a resistor and a capacitor, the step of calculating the first parameter may include calculating a resistance of the resistor and the step of calculating the second parameter may include calculating a capacitance of the capacitor. In certain embodiments of the method or apparatus, the step of applying the first input signal may include applying a first input current, the step of obtaining the first output signal may occur during the step of applying the first input signal, the step of applying the second input signal may include applying a second input current until a predetermined percentage of a voltage reference is reached, and the step of obtaining the second output signal may occur after applying the second input current until the predetermined percentage of the voltage reference is reached.

According to an embodiment of the method or apparatus, the step of applying the first input signal may include applying a first input current from a current source, and the step of applying the second input signal may include applying a second input current from the current source. In addition, the two or more components may be external and discrete components coupled to the single pin simultaneously. In certain embodiments of the method or apparatus, the step of obtaining the first output signal may include obtaining an N-bit first output value corresponding to the first output signal, wherein N is greater than or equal to 2, the step of obtaining the second output signal may include obtaining an N-bit second output value corresponding to the second output signal, and the first parameter and the second parameter may include independent variables. In some embodiments of the method or apparatus, the integrated circuit may include configured to calculate at least one of an external temperature, a maximum inductor current, and a loop gain correction.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Measurements of external components may be obtained by an IC with an LED controller for numerous reasons. For example, the resistance of a Negative Temperature Coefficient (NTC) resistor may be obtained to estimate the external temperature on a circuit board that includes the IC. Additionally, measurements of external component properties, such as resistances, capacitances, currents, and/or voltages may be obtained to calculate a maximum inductor current of an inductor in the IC and/or a loop gain correction for control logic in the IC, in addition to calculating other parameters.

In some embodiments, the resistance may be measured to set control parameters of the LED controller. As an example, control parameters that may be set may include an average input current for dimmer compatibility, an average output LED current, and the like. In some embodiments, an IC with an LED controller may be configured to sense multiple measurements using a single pin and use the multiple measurements obtained via the single pin to set multiple control parameters of the LED controller. Because more control parameters of the LED controller may be set using less IC pins, the cost of the IC may be reduced while simultaneously increasing the functionality and control provided by the LED controller of the IC.

Figure 1:
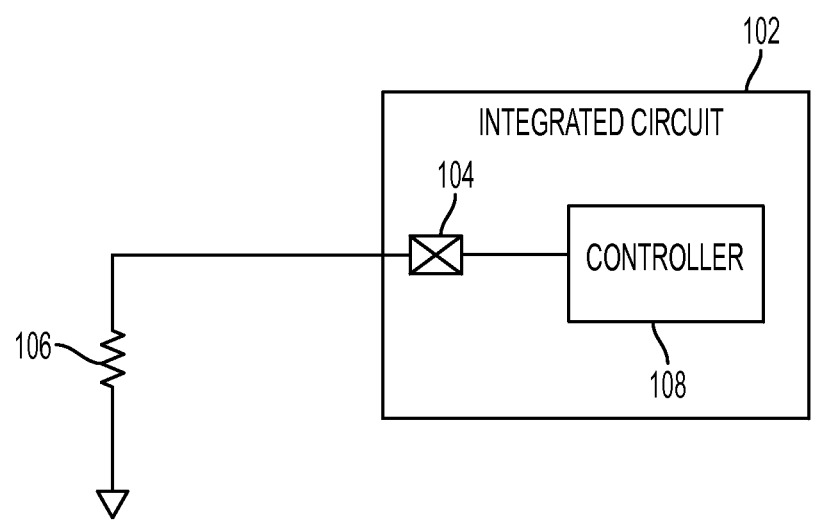
FIG. 1 is a schematic block diagram illustrating a conventional integrated circuit (IC) for setting a control parameter of an LED controller while the LED is operational.
Figure 2:
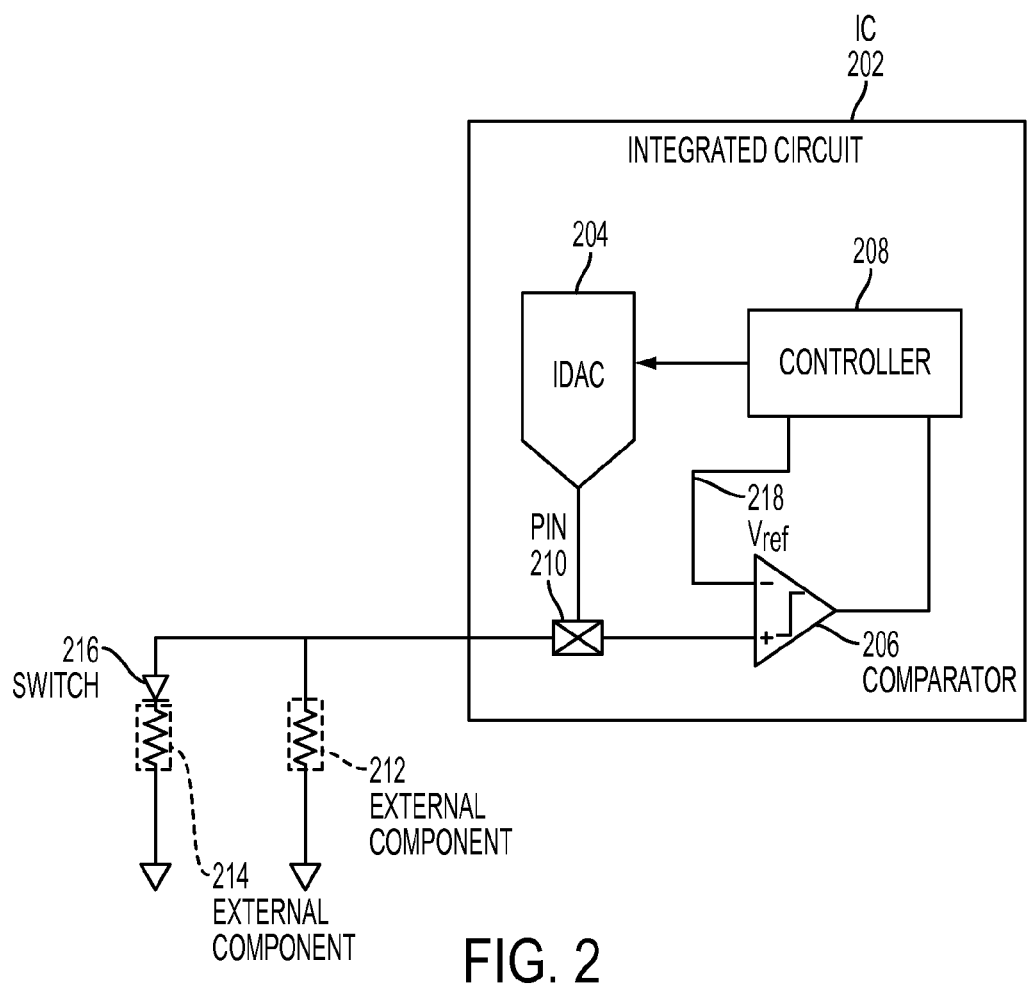
FIG. 2 is a schematic block diagram illustrating a first IC configuration for obtaining multiple resistance measurements via a single pin of the IC according to one embodiment of the disclosure.

FIG. 2 is a schematic block diagram illustrating an IC configuration for obtaining multiple resistance measurements via a single pin of the IC according to one embodiment of the disclosure. The IC 202 may include at least a current-mode digital-to-analog converter (IDAC) 204, a comparator 206, and an LED controller 208 for an LED-based light bulb. Although LED functionality related to the controller 208 is described throughout, the controller 208 may be a controller for any external device. A single pin 210 of the IC 202 may be coupled to two or more discrete components external to the IC 202. For example, as shown in the embodiment of FIG. 2, the two or more components may include a first resistor $R_1$ 212, a second resistor $R_2$ 214, and a switch, such as a diode 216. The first resistor 212 may be coupled directly to the IC pin 210, and the second resistor 214 may be coupled in series to the diode 216, which is coupled directly to the IC pin 210.

In some embodiments, the resistance of resistor $R_1$ 212 may correspond to one parameter used by the LED controller 208 and the resistance of resistor $R_2$ 214 may correspond to another parameter used by LED controller 208. These parameters of the external components may be used by the LED controller 208 to time operations within an LED-based light bulb, such as timing of an attach phase. The parameters may be used directly in calculating timings or indirectly in calculating other control parameters that are used for calculating timings.

By applying proper levels of current via the single IC pin 210 to the external circuit comprising the first resistor 212, second resistor 214, and the diode 216, two distinct measurements may be made using a single IC pin 210 to obtain the two resistances via a single IC pin 210. For example, a first current input signal may be applied from the IC 202 to the external circuit that is below the threshold level that activates the switch 216 to ensure that the switch 216 does not turn on, thereby isolating the resistor $R_2$ 214 from a measurement. In other words, with the switch 216 having a voltage drop of $V_d$, a first current input signal $I_{r1}$ that satisfies equation (1) provided below may be applied to ensure that the switch 216 does not turn on.

$$I_{r1}(\max) * R_1(\max) < V_d \tag{1}$$

According to the embodiment of FIG. 2, the first current input signal $I_{r1}$ may be applied from the IC 202 to the external circuit using IDAC 204. When the switch 216 is not activated, a voltage on the IC pin 210 may be the voltage across resistor $R_1$ 212. Therefore, as the first current input signal $I_{r1}$ is increased, the voltage across the resistor $R_1$ 212, i.e., the voltage on IC pin 210, also increases. The voltage on the IC pin 210 may be input to the comparator 206 referenced to a reference voltage $V_{ref1}$ 218 to determine the resistance of resistor $R_1$ 212. For example, when the voltage on the IC pin 210 triggers a transition on the comparator 206, the resistance of resistor $R_1$ 212 may be approximately estimated as:

$$R_1 = \frac{V_{ref1}}{I_{r1}}, \tag{2}$$

where $I_{r1}$ may be the first current input signal value that caused the voltage on the IC pin 210 to exceed $V_{ref1}$. To ensure that the switch 216 is not activated, the reference voltage $V_{ref1}$ may be less than $V_d$, i.e., $V_{ref1} < V_d$.

A second current input signal may be applied from the IC 202 to the external circuit that is above the threshold level that activates the switch 216 to obtain a second independent measurement that is based on both the resistance of resistor $R_2$ 214 and resistor $R_1$ 212. To ensure that the switch 216 stays on, a second current input signal $I_{r2}$ that satisfies equation (3) provided below may be applied.

$$V_{ref2}\left(1 + \frac{R_2(\max)}{R_1}\right) - R_2(\max) * I_{r2}(\min) > V_d \tag{3}$$

Similar to the first current input signal $I_{r1}$, the second current input signal $I_{r2}$ may be applied from the IC 202 to the external circuit using IDAC 204. As the second current input signal $I_{r2}$ is increased, the voltage across the parallel combination of resistor $R_1$ 212 and resistor $R_2$ 214, i.e., the voltage on IC pin 210, also increases. The voltage on the IC pin 210 may be input to the comparator 206 referenced to a voltage $V_{ref2}$ 218 to determine the resistance of resistor $R_2$ 214. For example, when the voltage on the IC pin 210 triggers a transition on the comparator 206, the resistance of resistor $R_2$ 214 may be approximately estimated as:

$$R_2 = \frac{V_{ref2} - V_d}{I_{r2} - \frac{V_{ref2}}{R_1}} \tag{4}$$

where $I_{r2}$ may be the second current input signal value that caused the voltage on the IC pin 210 to exceed $V_{ref2}$.

Equations (2) and (4) define two distinct resistance measurements obtained independently, in which the only unknown variables in equations (2) and (4) are the resistances of resistor $R_1$ 212 and resistor $R_2$ 214. Accordingly, the resistances of resistor $R_1$ 212 and resistor $R_2$ 214 may be determined by solving equations (2) and (4) for the resistances of resistor $R_1$ 212 and resistor $R_2$ 214. The computation may be performed by the controller 208 and the values for $R_1$ 212 and $R_2$ 214 stored in memory and used when controlling the LED-based light bulb.

Figure 3:
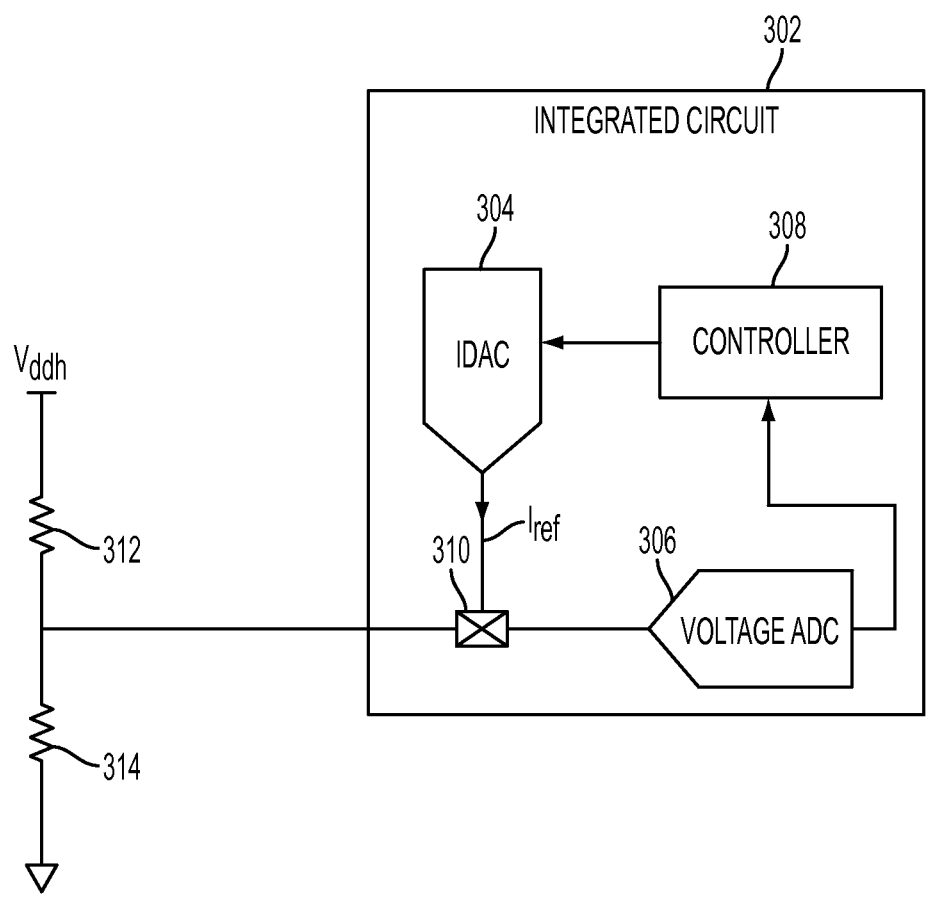
FIG. 3 is a schematic block diagram illustrating a second IC configuration for obtaining multiple resistance measurements via a single pin of the IC according to one embodiment of the disclosure.

FIG. 3 is a schematic block diagram illustrating another IC configuration for obtaining multiple resistance measurements via a single pin of the IC according to one embodiment of the disclosure. The IC 302 may include at least an IDAC 304, a voltage-mode analog-to-digital converter (ADC) 306, and an LED controller 308 for an LED-based light bulb. A single pin 310 of the IC 302 may be coupled to two or more discrete components external to the IC 302. For example, as shown in the embodiment of FIG. 3, the components may include a first resistor $R_1$ 312 and a second resistor $R_2$ 314. Both the first resistor 312 and the second resistor $R_2$ 314 may be coupled directly to the IC pin 310.

In some embodiments, the resistance of resistor $R_1$ 312 and the resistance of resistor $R_2$ 314 may be used as control parameters in the LED controller 308. By measuring the voltage on the IC pin 310 with and without current applied, two distinct voltage measurements may be made using a single IC pin 310 to obtain the two resistances via a single IC pin 310. For example, the voltage on the IC pin 310 may be determined when no current is applied to the external circuit from the IC 302. In other words, a first current input signal that is zero may be applied from the IC 302 to the external circuit. With no current applied from the IC 302 to the external circuit, the voltage on the IC pin 310 may be represented as a combination of parameters of the external components as:

$$V_1 = V_{ddh} \frac{R_2}{R_1 + R_2}, \tag{5}$$

where $V_1$ is the voltage on the IC pin 310 measured with the voltage ADC 306 when the current applied from the IC 302 using the IDAC 304 is zero.

In some embodiments, the digital output of the voltage ADC 306 may be written as:

$$D_{out} = \frac{V_{in}}{V_{ref}}, \tag{6}$$

where $V_{in}$ may be the input to the voltage ADC 306 and $V_{ref}$ may be the reference voltage of the voltage ADC 306.

Therefore, the digital output of the measured voltage $V_1$ defined in equation (5) may be written as:

$$D_1 = \left(V_{ddh}\frac{R_2}{R_1 + R_2}\right)\frac{1}{V_{ref}}. \quad (7)$$

In some embodiments, $V_{ref}$ may be chosen to be proportional or equal to $V_{ddh}$ such that equation (7) becomes:

$$D_1 = \left(\frac{R_2}{R_1 + R_2}\right)\frac{1}{K}, \quad (8)$$

where $K = V_{ref}/V_{ddh}$.

To obtain a second independent measurement, current may be applied from the IC 302 to the external circuit using the IDAC 304 of the IC 302, and a second voltage on the IC pin 310 may be measured with the current applied. In other words, a second current input signal may be applied from the IC 302 to the external circuit that is non-zero. When current with a value of $I_{ref}$ is applied from the IC 302 to the external circuit, the voltage on the IC pin 310 may be determined to be:

$$V_2 = I_{ref} * R_1 \parallel R_2 + V_{ddh}\frac{R_2}{R_1 + R_2}, \quad (9)$$

where $V_2$ is the voltage on the IC pin 310 measured with the voltage ADC 306 when the current $I_{ref}$ applied from the IC 302 using the IDAC 304 is non-zero. In some embodiments, the digital output of the measured voltage $V_2$ defined in equation (9) may be written as:

$$D_2 = \left(\frac{R_2}{R_1 + R_2}\right)\frac{1}{K} + (I_{ref} * R_1 \parallel R_2)\frac{1}{K * V_{ddh}}, \quad (10)$$

where $K = V_{ref}/V_{ddh}$, as before. According to an embodiment, the current $I_{ref}$ from the current source IDAC 304 may be defined as a function of the power supply $V_{ddh}$ such that:

$$I_{ref} = K_1 * V_{ddh}, \quad (11)$$

where $K_1$ may be a constant with a unit of conductance that defines the proportional relationship between the power supply $V_{ddh}$ and the current $I_{ref}$. By defining the current $I_{ref}$ as shown in equation (11), the digital output of the measured voltage $V_2$ defined in equation (10) may be rewritten as:

$$D_2 = \left(\frac{R_2}{R_1 + R_2}\right)K + (R_1 \parallel R_2)\frac{K_1}{K}. \quad (12)$$

Equations (5) and (9), or their digital counterpart equations (8) and (12), define two distinct independent measurements in which the only unknown variables are the resistances of resistor $R_1$ 312 and resistor $R_2$ 314. Accordingly, the resistances of resistor $R_1$ 312 and resistor $R_2$ 314 may be determined by simultaneously solving equations (5) and (9), or equations (8) and (12), for the resistances of resistor $R_1$ 312 and resistor $R_2$ 314. The computation may be performed by the controller 308 and the values for $R_1$ 312 and $R_2$ 314 may be stored in memory and used when controlling the LED-based light bulb.

In some embodiments, the variability associated with the power supply $V_{ddh}$ may be substantial, or a control parameter of the LED controller 308 may require low power supply variability. To reduce measurement sensitivity to power supply variation, a parameter of the external circuit calculated to set a control parameter of the LED controller 308 may be a parameter with little or no power supply variability, such as a ratio of the resistances of resistor $R_1$ 312 and resistor $R_2$ 314. For example, as shown in equation (11), in some embodiments, $I_{ref}$ may be generated based on the same power supply that supplies voltage $V_{ddh}$ to the external circuit. That is, the second current input signal may be generated based, at least in part, on the supply voltage that is also supplied to the external circuit that includes resistor $R_1$ 312 and resistor $R_2$ 314. Accordingly, the independent resistance values of resistor $R_1$ 312 and $R_2$ 314 calculated by simultaneously solving equations (5) and (9), or equations (8) and (12), may each exhibit the same power supply variability. However, by calculating the ratio of the resistance values of resistors $R_1$ 312 and $R_2$ 314 and using the ratio of the resistance values within control logic of the controller 308, the control may exhibit little or no power supply variability. This may be possible because the power supply variability associated with each resistance value of resistors $R_1$ 312 and $R_2$ 314 is factored out by using the ratio of the resistance values as the control parameter.

Figure 4:
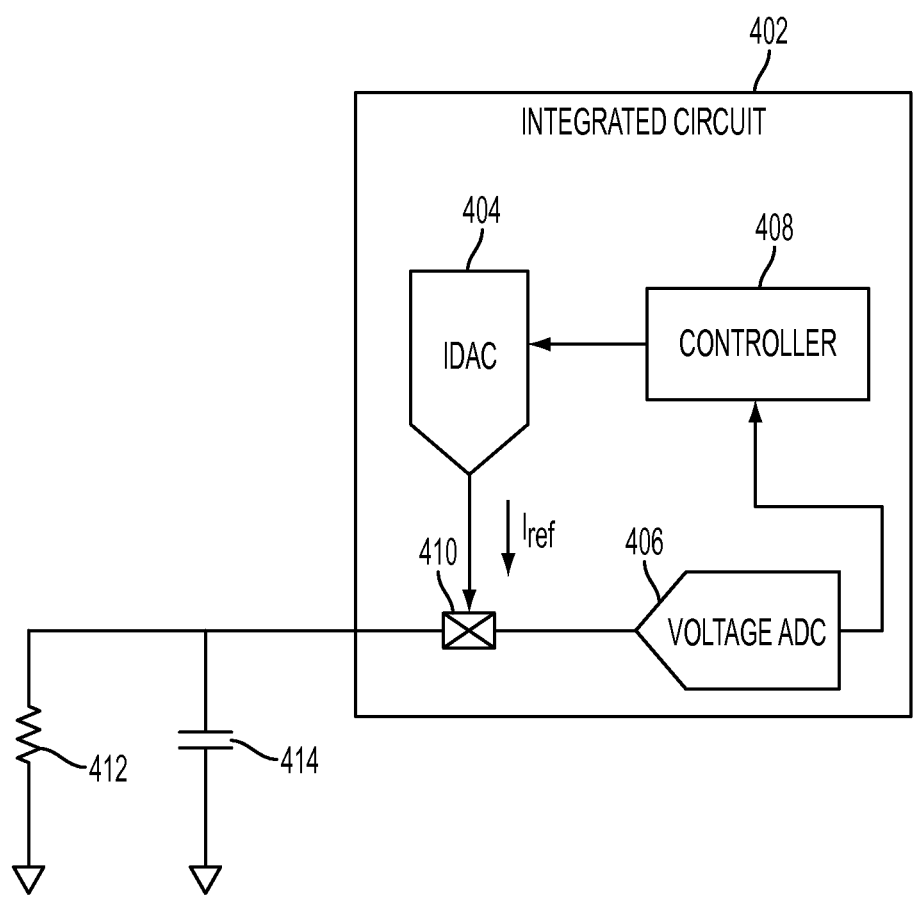
FIG. 4 is a schematic block diagram illustrating an IC configuration for obtaining resistance and capacitance measurements via a single pin of the IC according to one embodiment of the disclosure.

FIG. 4 is a schematic block diagram illustrating an IC configuration for obtaining resistance and capacitance measurements via a single pin of the IC according to an embodiment of the disclosure. The IC 402 may include at least an IDAC 404, a voltage-mode ADC 406, and an LED controller 408 for an LED-based light bulb. A single pin 410 of the IC 402 may be coupled to two or more discrete components external to the IC 402. For example, as shown in the embodiment of FIG. 4, the components may include a resistor $R_1$ 412 and a capacitor $C_1$ 414. Both the resistor 412 and the capacitor $C_1$ 414 may be coupled directly to the IC pin 410.

In some embodiments, the resistance of resistor $R_1$ 412 and the capacitance of capacitor $C_1$ 414 may be used as control parameters within the LED controller 408. Two distinct measurements may be performed and the measurements used in two independent equations that can be simultaneously solved to calculate the resistance value for resistor $R_1$ 412 and the capacitance value for capacitor $C_1$ 414. For example, a first current input signal $I_{r1}$ may be applied from the IC 402 to the external circuit including resistor $R_1$ 412 and capacitor $C_1$ 414 using IDAC 404. The resistance of the resistor $R_1$ 412 may subsequently be calculated similar to the calculation of resistor $R_1$ 212 in FIG. 2. That is, the voltage on the IC pin 410 may be input to a comparator (not shown) referenced to a voltage $V_{ref1}$ to determine the resistance of resistor $R_1$ 412. When the voltage on the IC pin 410 triggers a transition on the comparator (not shown), the resistance of resistor $R_1$ 412 may be approximately estimated as:

$$R_1 = \frac{V_{ref1}}{I_{r1}}, \quad (13)$$

similar to the calculation of the resistance of resistor $R_1$ 212 in FIG. 2, where $I_{r1}$ may be the first current input signal value that caused the voltage on the IC pin 410 to exceed $V_{ref1}$.

Figure 5:
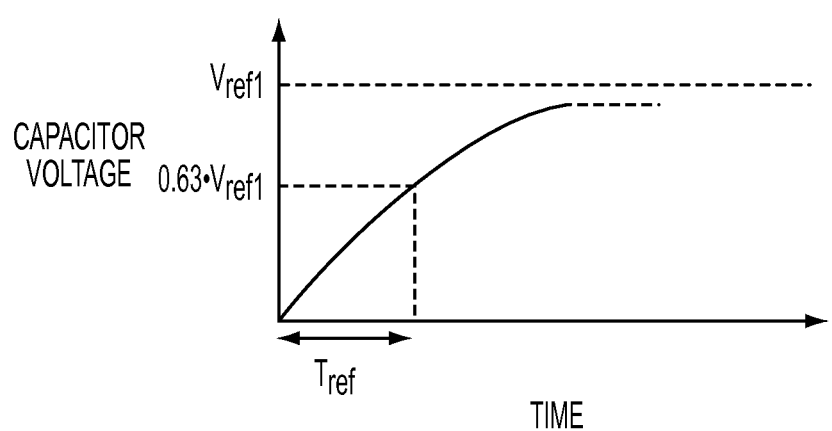
FIG. 5 is a chart illustrating the voltage on a capacitor resulting from the application of a current to the capacitor according to one embodiment of the disclosure.

For the measurement of the capacitance of capacitor $C_1$ 414, capacitor $C_1$ 414 may be initially discharged. A second current input signal may then be applied from the IC 402 to the external circuit using IDAC 404. For example, FIG. 5 provides a chart illustrating the voltage on a capacitor resulting from the application of a current to the capacitor for an amount of time according to one embodiment of the disclosure. As shown in the embodiments of FIG. 4 and FIG. 5, a current $I_{ref}$, which may be set to $I_{r1}$ as defined in equation (13), may be applied starting at time 0, and the time $T_{ref}$ required to charge capacitor $C_1$ 414 to 63% of $V_{refl}$ may be measured. In some embodiments, the voltage ADC 406 may be used to confirm that the voltage on the IC pin 410, and hence on capacitor $C_1$ 414, has reached approximately 63% of $V_{refl}$ and to trigger the end of the time measuring when the voltage has reached approximately 63% of $V_{refl}$. In other embodiments, a comparator (not shown) may be used to confirm that the voltage on the IC pin 410, and hence on capacitor $C_1$ 414, has reached approximately 63% of $V_{refl}$ and to trigger the end of the time measuring when the voltage has reached approximately 63% of $V_{refl}$. After the time $T_{ref}$ has been measured, the capacitance of capacitor $C_1$ 414 may be approximately estimated as:

$$C_1 = \frac{T_{ref}}{R_1}. \tag{14}$$

In another embodiment, the capacitance of capacitor $C_1$ 414 may be determined based on the rate of discharge of the capacitor $C_1$ 414. For example, IC pin 410 may be charged to a voltage of $V_{refl}$, thereby charging capacitor $C_1$ 414 to a voltage of $V_{refl}$, by applying a second current input signal for a predetermined amount of time to the external circuit using IDAC 404. The voltage ADC 406 may be used to measure the voltage on the IC pin 410. The second current input signal may be deactivated when the voltage on the IC pin has reached $V_{refl}$ so that no more current is applied to the external circuit, and the time required for the capacitor $C_1$ 414 to discharge to approximately 37% of $V_{refl}$ may be measured. In some embodiments, the voltage ADC 406 may be used to confirm that the voltage on the IC pin 410, and hence on capacitor $C_1$ 414, has reached approximately 37% of $V_{refl}$ and to trigger the end of the time measuring when the voltage has reached approximately 37% of $V_{refl}$. In other embodiments, a comparator (not shown) may be used to confirm that the voltage on the IC pin 410, and hence on capacitor $C_1$ 414, has reached approximately 37% of $V_{refl}$ and to trigger the end of the time measuring when the voltage has reached approximately 37% of $V_{refl}$. The time $T_{dis}$ may represent the time required for the IC pin 410 to discharge from $V_{refl}$ to approximately $0.37 * V_{refl}$, and the capacitance of capacitor $C_1$ 414 may be determined as:

$$C_1 = \frac{T_{dis}}{R_1}. \tag{15}$$

Although FIGS. 2-4 illustrate embodiments in which two parameters corresponding to two external components are calculated, those having ordinary skill in the art should appreciate that different combinations of FIGS. 2-4 may be used to derive measurements more than two external components from a single IC pin. For example, in some embodiments the external circuit may include two resistors and a capacitor to derive three values in the LED controller. In general, multiple variations of discrete components can be combined and simultaneously coupled to a single pin as illustrated in FIGS. 2-4 to measure multiple external components to an LED controller without departing from this disclosure in spirit or scope.

Figure 6:
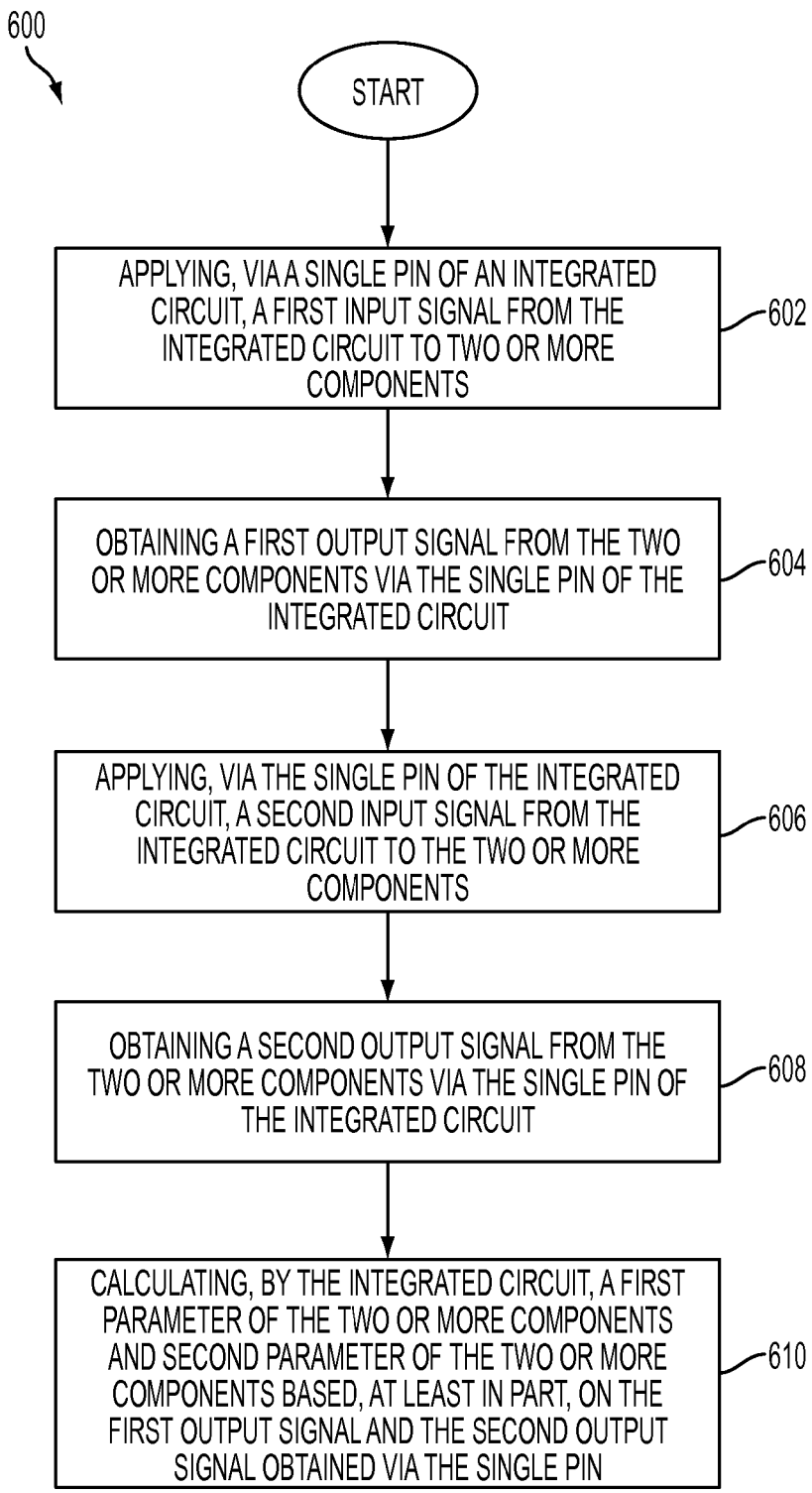
FIG. 6 is flow chart illustrating a method of obtaining multiple measurements via a single pin of an IC with an LED controller according to one embodiment of the disclosure.

FIG. 6 is flow chart illustrating a method of obtaining multiple measurements via a single pin of an IC with an LED controller according to one embodiment of the disclosure. A method 600 may begin at block 602 with applying, via a single pin of an integrated circuit, a first input signal from the integrated circuit to two or more components. For example, as illustrated in FIGS. 2-4, a first current input signal from a current DAC within an IC may be applied via a single pin of the IC to an external circuit including two or more external and discrete components.

At block 604, a first output signal may be obtained from the two or more components via the single pin of the integrated circuit. For example, as illustrated in FIGS. 2-4, a voltage may be obtained from the external circuit including two or more external and discrete components via the IC pin.

At block 606, method 600 may include applying, via the single pin of the integrated circuit, a second input signal from the integrated circuit to the two or more components, and at block 608, method 600 may include obtaining a second output signal from the two or more components via the single pin of the integrated circuit. As discussed above the second input signal may be a current signal from a current DAC of an IC, and the second output signal may be a voltage obtained from the external circuit including two or more external and discrete components via the IC pin.

At block 610, method 600 includes calculating, by the integrated circuit, a first parameter of the two or more components and second parameter of the two or more components based, at least in part, on the first output signal and the second output signal obtained via the single pin. The two or more parameters may either be values of the two or more components or a representation, such as a ratio, of combinations of parameters of the two or more components. In one embodiment, the first parameter and the second parameter may be a value, such as a resistance, capacitance, current, or voltage, of the first and second components. In another embodiment, the first parameter may be a first value, such as a first resistance, capacitance, current, or voltage of a first component, such as a resistor or capacitor, of the two or more components, and the second parameter may be a ratio of the first value to a second value of a second component of the two or more components, such as a ratio of resistances of two resistors.

In some embodiments, obtaining the first output signal, such as at block 604, may include obtaining an N-bit first output value corresponding to the first output signal, wherein N is greater than or equal to 2. In addition, obtaining the second output signal, such as at block 608, may include obtaining an N-bit second output value corresponding to the second output signal. Furthermore, in some embodiments, the first parameter and the second parameter may be independent variables.

Although LED functionality related to the controller 208 of FIG. 2 is described throughout, the controller 208 may be a controller for any external device. For example, the controller 208 may be an audio controller measuring external components related to two different channels, such as a channel A and channel B or a left channel and a right channel. In one embodiment, the controller 208 may be an audio controller measuring gains for amplifiers for two different channels.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method comprising:
applying, via a single pin of an integrated circuit, a first input signal from the integrated circuit to two or more components;
obtaining a first output signal from the two or more components via the single pin of the integrated circuit;
applying, via the single pin of the integrated circuit, a second input signal from the integrated circuit to the two or more components;
obtaining a second output signal from the two or more components via the single pin of the integrated circuit; and
calculating, by the integrated circuit, a first parameter of the two or more components and a second parameter of the two or more components based, at least in part, on the first output signal and the second output signal obtained via the single pin.

2. The method of claim 1, wherein the first parameter is a first value of a first component of the two or more components and the second parameter is a second value of a second component of the two or more components.

3. The method of claim 1, wherein the first parameter is a first value of a first component of the two or more components and the second parameter is a ratio of the first value to a second value of a second component of the two or more components.

4. The method of claim 1, wherein the two or more components comprise at least a first resistor and a second resistor, and wherein calculating the first parameter comprises calculating a first resistance of the first resistor and calculating the second parameter comprises calculating a second resistance of the second resistor.

5. The method of claim 4, wherein the step of applying the first input signal comprises applying a first current input signal below a threshold level to activate a switch coupled to at least one of the two or more components, and wherein the step of applying the second input signal comprises applying a second current input signal above a threshold level to activate the switch.

6. The method of claim 4, wherein the step of applying the first input signal comprises applying a zero current input signal, and wherein the step of applying the second input signal comprises applying a non-zero current input signal.

7. The method of claim 6, wherein the step of applying the second input signal comprises generating the second input signal based, at least in part, on a supply voltage that is also supplied to the two or more components.

8. The method of claim 1, wherein the two or more components comprise at least a first resistor and a second resistor, and wherein calculating the first parameter comprises calculating a first ratio or combination of resistances of the first resistor and the second resistor and calculating the second parameter comprises calculating a second ratio or combination of resistances of the first resistor and the second resistor.

9. The method of claim 1, wherein the two or more components comprise at least a resistor and a capacitor, and wherein the step of calculating the first parameter comprises calculating a resistance of the resistor and the step of calculating the second parameter comprises calculating a capacitance of the capacitor.

10. The method of claim 9, wherein the step of applying the first input signal comprises applying a first input current, wherein the step of obtaining the first output signal occurs during the step of applying the first input signal, wherein the step of applying the second input signal comprises applying a second input current until a predetermined percentage of a voltage reference is reached, and wherein the step of obtaining the second output signal occurs after applying the second input current until the predetermined percentage of the voltage reference is reached.

11. The method of claim 1, wherein the step of applying the first input signal comprises applying a first input current from a current source, and wherein the step of applying the second input signal comprises applying a second input current from the current source.

12. The method of claim 1, wherein the step of obtaining the first output signal comprises obtaining an N-bit first output value corresponding to the first output signal, wherein N is greater than or equal to 2, wherein the step of obtaining the second output signal comprises obtaining an N-bit second output value corresponding to the second output signal, and wherein the first parameter and the second parameter comprise independent variables.

13. The method of claim 1, wherein the two or more components are external and discrete components coupled to the single pin simultaneously.

14. An apparatus comprising:
an integrated circuit configured to be coupled to two or more external components through a single pin,
wherein the integrated circuit is configured to:
apply, via the single pin, a first input signal to the two or more components;
obtain, via the single pin, a first output signal from the two or more components;
apply, via the single pin, a second input signal to the two or more components;
obtain, via the single pin, a second output signal from the two or more components; and
calculate at least a first parameter of the two or more components and a second parameter of the two or more components based, at least in part, on the first output signal and the second output signal obtained via the single pin.

15. The apparatus of claim 14, wherein the first parameter is a first value of a first component of the two or more components and the second parameter is a second value of a second component of the two or more components.

16. The apparatus of claim 14, wherein the first parameter is a first value of a first component of the two or more components and the second parameter is a ratio of the first value to a second value of a second component of the two or more components.

17. The apparatus of claim 16, wherein the integrated circuit comprises:
a current source coupled to the single pin and configured to apply the first input signal and to apply the second input signal to the single pin; and
an amplifier coupled to the single pin and configured to obtain the first output signal and to obtain the second output signal from the single pin.

18. The apparatus of claim 16, wherein the integrated circuit is configured to obtain an N-bit first output value corresponding to the first output signal, wherein N is greater than or equal to 2, wherein the integrated circuit is configured to obtain an N-bit second output value corresponding to the second output signal, and wherein the first parameter and the second parameter comprise independent variables.

19. The apparatus of claim 16, wherein the integrated circuit comprises a light emitting diode (LED) controller for a LED-based light bulb.

20. The apparatus of claim 19, wherein the integrated circuit is configured to calculate at least one of an external temperature, a maximum inductor current, and a loop gain correction.

21. The apparatus of claim 16, wherein the two or more external components are discrete components coupled to the single pin simultaneously.

22. The apparatus of claim 14, wherein the two or more components comprise at least a first resistor and a second resistor, and wherein the first calculated parameter comprises a first resistance of the first resistor and the second calculated parameter comprises a second resistance of the second resistor.

23. The apparatus of claim 22, wherein the integrated circuit is configured to apply the first input signal by applying a first current input signal below a threshold level to activate a switch coupled to at least one of the two or more components, and wherein the integrated circuit is configured to apply the second input signal by applying a second current input signal above a threshold level to activate the switch.

24. The apparatus of claim 22, wherein the integrated circuit is configured to apply the first input signal by applying a zero current input signal, and wherein the integrated circuit is configured to apply the second input signal by applying a non-zero current input signal.

25. The apparatus of claim 24, wherein the integrated circuit is configured to apply the second input signal by generating the second input signal based, at least in part, on a supply voltage that is also supplied to the two or more components.

26. The apparatus of claim 14, wherein the two or more components comprise at least a first resistor and a second resistor, and wherein calculating the first parameter comprises calculating a first ratio or combination of resistances of the first resistor and the second resistor and calculating the second parameter comprises calculating a second ratio or combination of resistances of the first resistor and the second resistor.

27. The apparatus of claim 14, wherein the two or more components comprise at least a resistor and a capacitor, and wherein the first calculated parameter comprises a first resistance of the resistor and the second calculated parameter comprises a capacitance of the capacitor.

28. The apparatus of claim 27, wherein the integrated circuit is configured to obtain the first output signal while applying the first input signal, and wherein the integrated circuit is configured to obtain the second output signal after applying the second input signal until a predetermined percentage of a voltage reference is reached.

* * * * *